United States Patent
Jameson et al.

(10) Patent No.: US 9,711,719 B2
(45) Date of Patent: Jul. 18, 2017

(54) NONVOLATILE MEMORY ELEMENTS HAVING CONDUCTIVE STRUCTURES WITH SEMIMETALS AND/OR SEMICONDUCTORS

(71) Applicant: ADESTO TECHNOLOGIES CORPORATION, Santa Clara, CA (US)

(72) Inventors: John Ross Jameson, Menlo Park, CA (US); Foroozan Sarah Koushan, San Jose, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 117 days.

(21) Appl. No.: 14/217,256

(22) Filed: Mar. 17, 2014

(65) Prior Publication Data

US 2014/0299832 A1    Oct. 9, 2014

Related U.S. Application Data

(60) Provisional application No. 61/798,919, filed on Mar. 15, 2013.

(51) Int. Cl.
 *H01L 45/00* (2006.01)
(52) U.S. Cl.
 CPC ........ *H01L 45/1253* (2013.01); *H01L 45/085* (2013.01); *H01L 45/1233* (2013.01); *H01L 45/1266* (2013.01); *H01L 45/146* (2013.01); *H01L 45/1658* (2013.01)
(58) Field of Classification Search
 CPC ............. H01L 45/1253; H01L 45/1266; H01L 45/1233; H01L 45/085; H01L 45/146; H01L 45/1658

USPC ............................................................. 257/4
See application file for complete search history.

(56) References Cited

U.S. PATENT DOCUMENTS

| | | | |
|---|---|---|---|
| 5,761,115 A | 6/1998 | Kozicki et al. |
| 6,418,049 B1 | 7/2002 | Kozicki et al. |
| 6,487,106 B1 | 11/2002 | Kozicki |
| 6,635,914 B2 | 10/2003 | Kozicki et al. |
| 6,927,411 B2 | 8/2005 | Kozicki |
| 7,101,728 B2 | 9/2006 | Kozicki et al. |
| 7,332,377 B2 | 2/2008 | Happ et al. |
| 7,368,314 B2 | 5/2008 | Ufert |
| 7,372,065 B2 | 5/2008 | Kozicki et al. |
| 7,423,281 B2 | 9/2008 | Rohr |
| 7,602,042 B2 | 10/2009 | Ahn et al. |
| 7,700,398 B2 | 4/2010 | Pinnow |
| 7,718,537 B2 | 5/2010 | Ufert |

(Continued)

OTHER PUBLICATIONS

PCT International Search Report for International Application No. PCT/US14/30871, dated Aug. 27, 2014.

(Continued)

*Primary Examiner* — Allan R Wilson (57) ABSTRACT

A memory element programmable between different impedance states can include a first electrode layer comprising a semimetal or semiconductor (semimetal/semiconductor); a second electrode; and a switch layer formed between the first and second electrodes and comprising an insulating material; wherein atoms of the semimetal/semiconductor provide a reversible change in conductivity of the insulating material by application of electric fields.

13 Claims, 5 Drawing Sheets

(56) References Cited

U.S. PATENT DOCUMENTS

| | | | |
|---|---|---|---|
| 7,728,322 B2 | 6/2010 | Kozicki | |
| 7,829,134 B2 | 11/2010 | Pinnow et al. | |
| 7,851,777 B2* | 12/2010 | Arai et al. | 257/2 |
| 8,134,139 B2 | 3/2012 | Lin et al. | |
| 8,610,102 B2* | 12/2013 | Kawashima et al. | 257/4 |
| 8,884,397 B2* | 11/2014 | Aratani et al. | 257/529 |
| 8,907,313 B2* | 12/2014 | Barabash et al. | 257/2 |
| 2004/0124407 A1 | 7/2004 | Kozicki et al. | |
| 2005/0226036 A1 | 10/2005 | Aratani et al. | |
| 2006/0172067 A1 | 8/2006 | Ovshinsky et al. | |
| 2007/0161186 A1 | 7/2007 | Ho | |
| 2009/0085025 A1* | 4/2009 | Arai et al. | 257/4 |
| 2010/0012917 A1 | 1/2010 | Takaura et al. | |
| 2010/0133496 A1 | 6/2010 | Lee et al. | |
| 2011/0027597 A1 | 2/2011 | Ohba et al. | |
| 2011/0031466 A1 | 2/2011 | Kagawa et al. | |
| 2011/0073825 A1* | 3/2011 | Aratani et al. | 257/2 |
| 2011/0194329 A1 | 8/2011 | Ohba et al. | |
| 2012/0236625 A1 | 9/2012 | Ohba et al. | |
| 2013/0264534 A1* | 10/2013 | Hwang | H01L 45/145 257/2 |
| 2014/0166958 A1* | 6/2014 | Barabash et al. | 257/1 |
| 2016/0248004 A1* | 8/2016 | Kagawa | H01L 45/12 |

OTHER PUBLICATIONS

PCT Written Opinion of the International Search Authority for International Application No. PCT/US14/30871, dated Aug. 27, 2014.

PCT International Search Report for International Application No. PCT/US14/20032, dated Mar. 10, 2015.

PCT International Search Report and Written Opinion for International Application No. PCT/US2014/011146, dated May 2, 2014.

Non-final Office Action for U.S. Appl. No. 13/829,941, dated Mar. 27, 2015.

* cited by examiner

FIG. 9B
(FORMING)

NONVOLATILE MEMORY ELEMENTS HAVING CONDUCTIVE STRUCTURES WITH SEMIMETALS AND/OR SEMICONDUCTORS

This application claims the benefit of U.S. provisional patent application Ser. No. 61/798,919, filed on Mar. 15, 2013, the contents of which are incorporated by reference herein.

TECHNICAL FIELD

The present disclosure relates generally to memory elements, and more particularly to memory elements programmable between two or more impedance states in response to the application of electric fields.

BACKGROUND

There is a need to store information for long periods of time without the use of power. For example, in many electronic devices and systems, data can be stored in a nonvolatile memory, or quasi-nonvolatile memory. A quasi-nonvolatile memory can be a memory with a 'refresh' interval order of magnitude longer than a dynamic random access memory (DRAM).

One type of memory is a conductive bridging random access memory (CBRAM). A CBRAM can have memory elements that store information in terms of the resistance level of two-terminal structure, which can include a metal/insulator/metal structure. A change in resistance can come about by the creation and destruction of a conductive pathway made mostly or, more commonly, entirely of metal atoms.

DETAILED DESCRIPTION

According to embodiments, a memory element can include a memory cell that utilizes a semiconductor or semimetal (including metalloids) to form a conductive pathway through an insulating switch layer.

In some embodiments, a memory element can have a structure like that of a conventional conductive bridging random access memory (CBRAM) element, however the creation and destruction of a conductive pathway may include a semimetal or semiconductor. That is, reversible conductive pathway can be formed all, or in part, by a semimetal or semiconductor. In some embodiments, a conductive pathway may not include metal atoms, or a majority of a conductive pathway can be formed by non-metal (e.g., semimetal/semiconductor) atoms.

Compared to a conventional metal-based CBRAM cell, a conductive pathway formed by a semimetal or semiconductor may require more atoms to be present in the conductive pathway to achieve a comparably low resistance level, making such a conductive pathway less susceptible to on-state retention failures (i.e., unwanted, spontaneous transitions from low resistance to high resistance).

Additionally, for a programming operation which produces a conductive path of a given "width" (e.g., 1, 2, or 3 atoms), a conductive pathway based on a semimetal or semiconductor may have a resistance substantially higher than a comparable path based on a metal (e.g., ~100 k$\Omega$ for a bismuth (Bi) pathway with a 1-atom constriction vs. ~10 k$\Omega$ for a copper Cu pathway with a 1-atom constriction). This can lead to lower current and/or power requirements for programming and/or erase than conventional CBRAM cells.

While some conventional CBRAM elements can attain their low resistance by electrically introducing metal atoms into the insulating layer dispersed between the two electrodes, in others, a metal oxide is often used as the insulating layer, and the low-resistance state is often said to arise from the presence of metal atoms that remain after oxygen has been removed from some region of the metal oxide. For example, titanium (Ti) atoms can remain after (oxygen) (O) has been removed from a titanium oxide ($TiO_2$) layer. Thus, in both conventional cases, the low-resistance state may be ascribed to the presence of metal atoms. In sharp contrast, according to embodiments herein, a low-resistance state (or a significant portion of the low resistance state) may be ascribed to the present of semimetal and/or semiconductor atoms, not metal atoms.

According to particular embodiments, a memory cell can include a first electrode (which can be referred to as an anode), a second electrode (which can be referred to as a cathode), and an insulating layer dispersed between the two. The anode can include one or more semimetals (e.g., Bi) and/or one or more semiconductors (e.g., Si). Such a semimetal or semiconductor can also include any of the following: element which is a semimetal or semiconductor in at least one of its possible crystal phases (e.g., Te, which has a high-pressure metallic form and a low-pressure semiconductor form with a bandgap of 0.3 eV); an element which may become semimetallic or semiconducting upon reduction to nano-scale or atomic-scale dimensions; or an alloy or other compound containing one or more such elements (e.g., $TiTe_x$).

An anode may serve as a source of those atoms that can form one or more conductive pathways in the insulating layer (i.e., conductive pathways formed, at least in part, by a semimetal or semiconductor). Additional conductive layers may be present on top of the anode or below the cathode to aid in fabrication or in operation of the circuit used to control the cell (e.g., to lower the resistance of the connection to the cell).

An electrical pulse can be applied between the two electrodes to cause the semimetal or semiconductor atoms to form a conductive pathway. An electrical pulse different in magnitude or polarity could be used to disrupt this conductive pathway to return the device to a higher resistance state. An initial "forming" electrical pulse may be applied to an as-fabricated device to introduce the semimetal or semiconductor atoms into the insulating layer, with the subsequent program or erase operations causing the semimetal or semiconductor atoms to rearrange into low-resistance or high-resistance pathways, respectively.

In addition or alternatively, the semimetal or semiconductor atoms may be introduced and removed from the insulating layer with each program/erase cycle of the device.

In addition or alternatively, the semimetal or semiconductor atoms can be introduced into the insulating layer by an initial thermal or chemical treatment, instead of an electrical pulse, and program/erase electrical pulses used to rearrange the atoms to form a low-high-resistance pathways, respectively.

In addition or alternatively, the semimetal or semiconductor atoms can be introduced into the insulating layer in situ, as the insulating layer is formed.

Embodiments can include memory device architectures like those of conventional CBRAM devices (including resistive RAM (RRAM) devices), but include memory elements as described herein. As a result, memory devices according to embodiments can have programming power supply voltages and/or durations that may be less than those of such conventional devices. Memory devices according to embodiments can have greater wear cycles, or greater time periods between "reconditioning" type operations than conventional memory devices. Reconditioning type operations can be operations that reprogram elements into particular states (e.g., tighten resistance distributions, program the cells after erasing/programming all the cells to a same state). Memory devices according to embodiments can have wear algorithms that allow for a larger number of cycles before data are shifted between different memory blocks, or the like.

Figure 1:
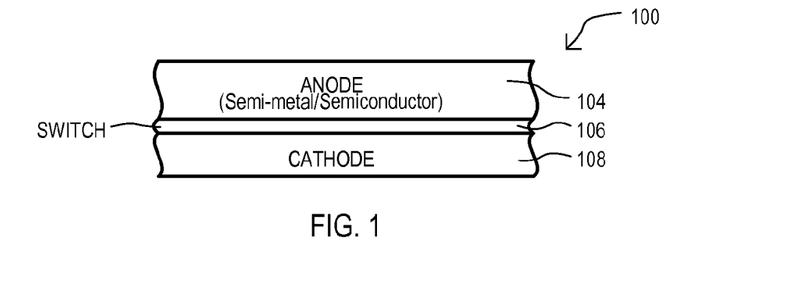
FIG. 1 is a side cross sectional view of a memory element according to an embodiment.

In the embodiments disclosed herein, like sections are referred to by the same reference character but with the leading digit(s) corresponding to the FIG. 1 is a side cross sectional representation of a memory element 100 according to an embodiment. A memory cell can include a first electrode 104, a switch layer 106, and second electrode 108. In some embodiments, a first electrode 104 can include one or more semimetals or semiconductors. Such semimetals and/or semiconductors can include any of: carbon (C), tellurium (Te), antimony (Sb), arsenic (As), germanium (Ge), silicon (Si), bismuth (Bi), tin (Sn), sulfur (S), or selenium (Se), for example.

A switch layer 106 can be formed between first and second electrodes 104/108. A switch layer 106 can be formed of a material that can switch its conductivity by application of electric fields across the electrodes. According to embodiments, a switch layer 106 can be an insulating material in which conductive pathways can be formed and unformed by application of electric fields. Such conductive pathways can be formed, at least in part, from one or more semimetals and/or semiconductors (semimetal(s)/semiconductor(s)). In some embodiments, a switch layer 106 may have essentially none of the pathway forming semimetal(s)/semiconductor(s), with an anode 104 being the source of substantially all of the semimetal(s)/semiconductor(s). However, in other embodiments, a switch layer 106 may include some of the semimetal(s)/semiconductor(s), with an anode 104 contributing additional amounts of the semimetal(s)/semiconductor(s). In still other embodiments, a switch layer 106 may include the semimetal(s)/semiconductor(s), with an anode 104 contributing none, or very little of its semimetal(s)/semiconductor(s) in the formation of conductive pathways within switch layer 106.

In some embodiments, a switch layer 106 can be a metal oxide. In particular embodiments, a switch layer 106 can include any of gadolinium oxide (GdOx), hafnium oxide (HfOx), tantalum oxide (TaOx), aluminum oxide (AlOx) and/or zirconium oxide (ZrOx). It is understood that such metal oxides can have stoichiometric or non-stoichiometric forms.

In some embodiments, a first electrode 104 can include a semimetal(s)/semiconductor(s) and one or more other elements. In a particular embodiment, a first electrode 104 can be a binary alloy of the semimetal(s)/semiconductor(s) and another element. A metal of the first electrode 104 used in combination with the semimetal(s)/semiconductor(s) can be a transition metal. In some embodiments, such a metal can be a rare earth metal. However, in other embodiments, such a metal may not be a transition metal (and hence not a rare earth metal, either).

In a particular embodiments, a first electrode 104 can be a binary alloy of Te (with Te being the semimetal/semiconductor). In such a binary alloy, the other element of the alloy can be selected from Ti, Zr, Hf, aluminum (Al), gold (Au), barium (Ba), bromine (Br), cadmium (Cd), cerium (Ce), cobalt (Co), chromium (Cr), dysprosium (Dy), erbium (Er), europium (Eu), iron (Fe), gallium (Ga), gadolinium (Gd), holmium (Ho), indium (In), iridium (Ir), lanthanum (La), manganese (Mn), molybdenum (Mo), nickel (Ni), lead (Pb), palladium (Pd), praseodymium (Pr), platinum (Pt), rubidium (Rb), rhenium (Re), ruthenium (Ru), rhodium (Rh), samarium (Sm), strontium (Sr) and thallium (Tl). In particular embodiments, a first electrode can be an alloy of zirconium (Zr) and Te, or an alloy of Ti and Zr, or an alloy of Hf and Te. Further, a corresponding switch layer 106 can be ZrOx, TiOx, or HfOx, respectively.

In some embodiments, an oxide of a switch layer can be an oxide of an element included in first electrode. In a very particular embodiment, the switch layer can include a metal oxide and the first anode can include the metal of that metal oxide.

A second electrode 108 can be a conductive material suitable for a desired resistance, or process compatibility, etc. As but one very particular embodiment, a second electrode 108 can be formed of tantalum (Ta).

Figure 2A:
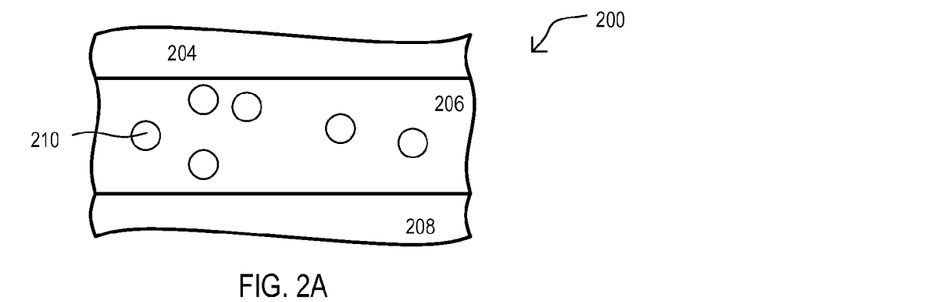
FIGS. 2A to 2C are side cross sectional views showing the formation of conductive regions within a switch layer of a memory element according to an embodiment.
Figure 2B:
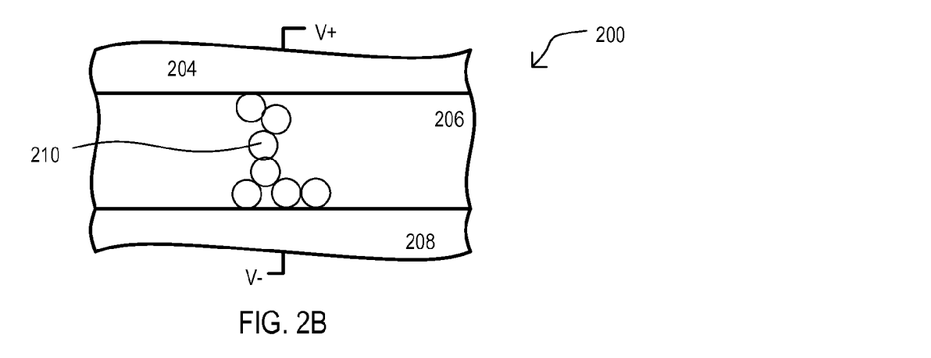
Figure 2C:
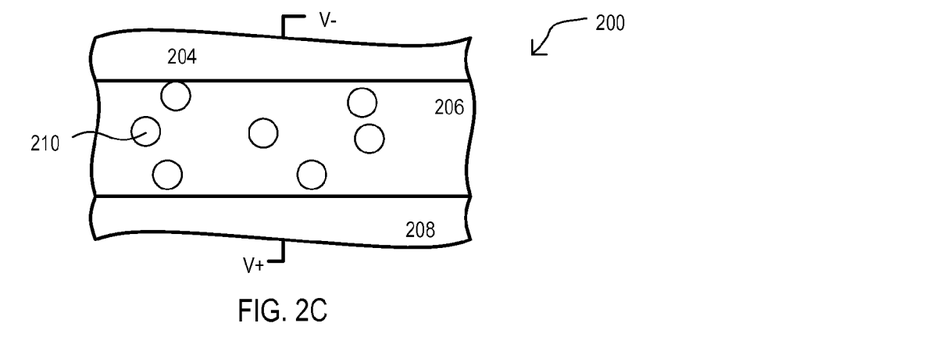

FIGS. 2A to 2C are side cross sectional views representing the formation of a conductive region with a semimetal(s)/semiconductor(s) according to embodiments. In a very particular embodiment, FIGS. 2A to 2C show formation operations for a memory element like that shown in FIG. 1.

FIG. 2A shows semimetal(s)/semiconductor(s) 210 within an insulating switch layer 206. In particular embodiments, 210 can represent atoms of semimetal(s)/semiconductor(s) element.

FIG. 2B shows the application of an electric field across the electrodes 204/208 of a first polarity. In response, conductive structures can be formed in the insulator material 206, changing the conductivity of the insulator material 206. Such conductive structures can be formed entirely of one or more semimetal(s)/semiconductor(s) atoms, or include a mix of semimetal(s)/semiconductor(s) atoms and other atom species.

FIG. 2C shows the application of an electric field across the electrodes 204/208 of a second polarity. In response, conductive structures can be removed.

It is understood that FIGS. 2A to 2C are but diagrammatic representations of operation. Actual position or states of semimetal(s)/semiconductor(s) atoms can take various forms. In some embodiments, portions, or all of a conductive structure may not move, but application of electric fields can change a state of the semimetal(s)/semiconductor(s) atoms and/or compounds.

FIGS. 3A to 3D are side cross sectional views representing the formation of a conductive regions within a memory element according to another embodiment. The embodiment of FIGS. 3A-3D shows an arrangement in which a semimetal(s)/semiconductor(s) can originate from an electrode 304 (e.g., anode) and move into switch layer 306. In a very particular embodiment, FIGS. 3A to 3D show formation operations for a memory element like that shown in FIG. 1.

Figure 3A:
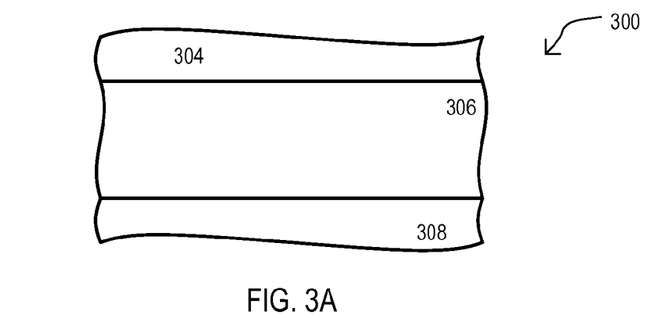
FIGS. 3A to 3D are side cross sectional views showing the formation of conductive regions within a switch layer of a memory element according to another embodiment.

FIG. 3A shows a memory element prior to the application of an electric field. Very little or none of the semimetal(s)/semiconductor(s) that form a conductive structure within the switch layer can be present in the switch layer 306.

Figure 3B:
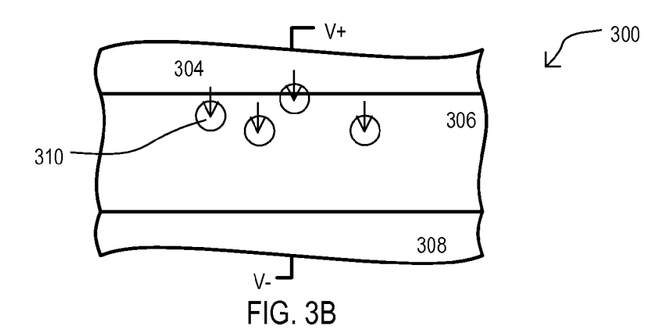

FIG. 3B shows the application of an electric field across the electrodes 304/308 of a first polarity. In response, semimetal(s)/semiconductor(s) 310 can move out of the first electrode 304 (i.e., anode) into the switch layer 306. As in the case above, 310 can represent semimetal(s)/semiconductor(s) atoms, but in other embodiments, semimetal(s)/semiconductor(s) can be compounds of more than one atom.

Figure 3C:
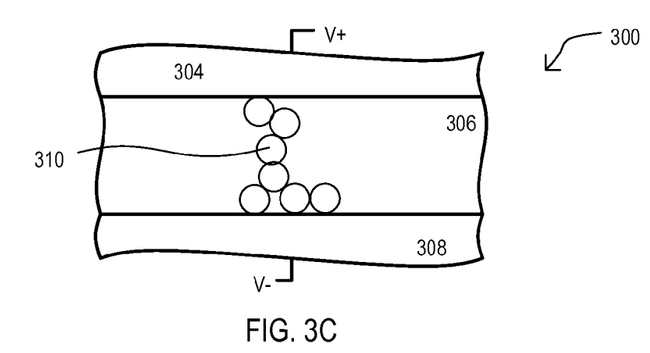

FIG. 3C shows the continued application of the electric field of FIG. 3B, or a subsequent application of the same electric field. In response to the electric field, the semimetal(s)/semiconductor(s) 310 that originated from first electrode 304 can form a conductive structure in the insulator material 306. Such conductive structures can be formed entirely of one or more semimetal(s)/semiconductor(s) atoms, or include a mix of semimetal(s)/semiconductor(s) atoms and other atom species.

Figure 3D:
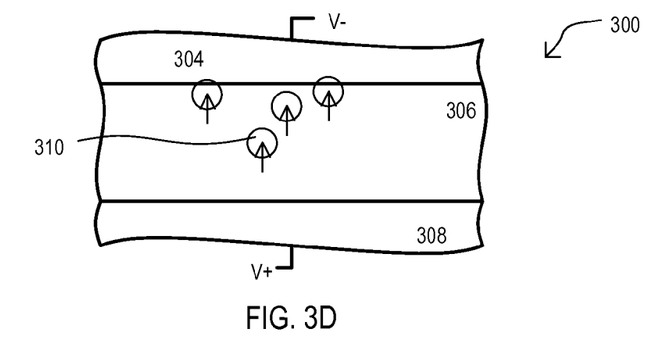

FIG. 3D shows the application of an electric field across the electrodes 304/308 of a second polarity. In response, conductive structures can be removed. In some embodiments, substantially all or a majority of the semimetal(s)/semiconductor(s) 310 can return to the first electrode 304, or migrate to a position in close proximity of the first electrode 304. However, in other embodiments, a portion of the semimetal(s)/semiconductor(s) 310 that originated from the first electrode 304 can remain in the switching layer.

Figure 4A:
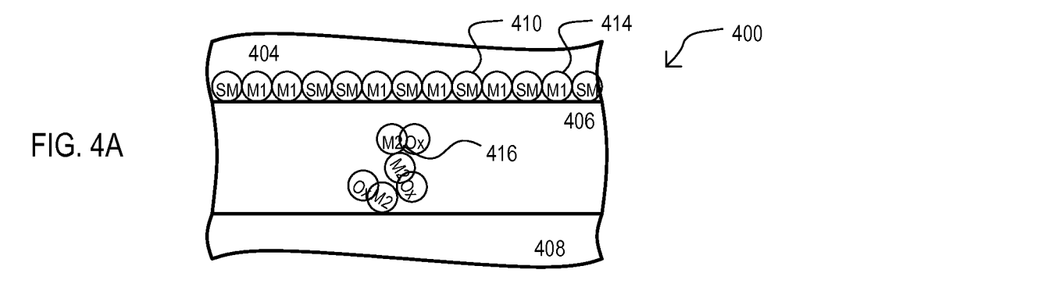
FIGS. 4A to 4C are side cross sectional views showing the formation of conductive regions within a switch layer of a memory element according to another embodiment.
Figure 4B:
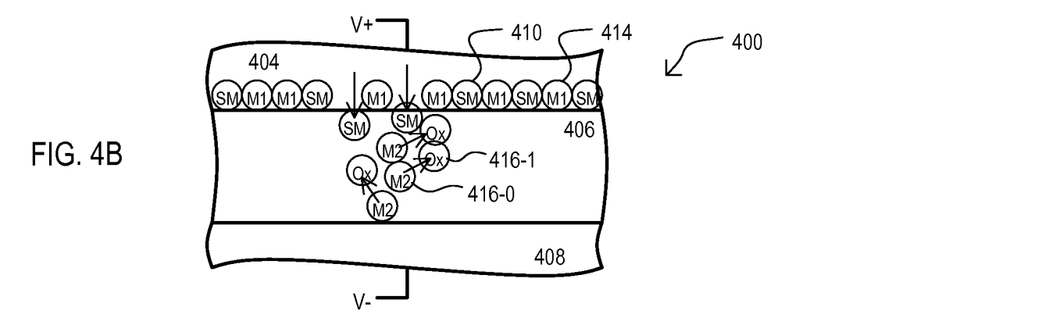
Figure 4C:
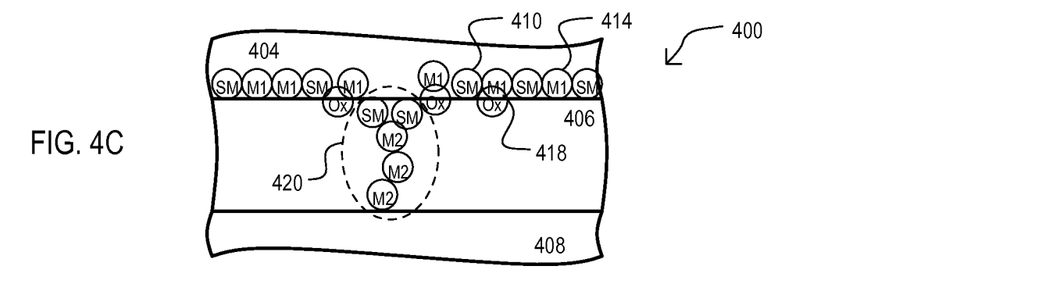

FIGS. 4A to 4C are side cross sectional views representing the formation of a conductive regions within a memory element according to a further embodiment. The embodiment of FIGS. 4A-4C shows an arrangement like that of FIG. 3A to 3D, but with filaments being formed by metal atoms present in a switching layer in addition to semimetal(s)/semiconductor(s) atoms. In a very particular embodiment, FIGS. 4A to 4C show formation operations for a memory element like that shown in FIG. 1.

FIG. 4A shows a memory element prior to the application of an electric field. A first electrode 404 can be an anode, and can include semimetal(s)/semiconductor(s) atoms (shown as SM) as well as anode metal atoms (shown as M1). Very little or none of the semimetal(s)/semiconductor(s) (SM) that can form a conductive structure within the switch layer can be present in the switch layer 406.

A switch layer 406 can be formed of, or include, one or more switch metal oxide molecules/compounds (one shown as 416). Such a switch metal oxide can include a switch oxide metal (M2) and one or more oxygen atoms (Ox). In some embodiments, a switch oxide metal (M2) can be the same as an anode metal (M1). However, in other embodiments, a switch oxide metal can be the same as an anode metal (i.e., M2=M1).

FIG. 4B shows the application of one or more electric field across the electrodes 404/408. In response, semimetal(s)/semiconductor(s) 410 can move out of the first electrode 404 (i.e., anode) into the switch layer 406. In addition, oxygen atoms (one shown as 416-1) can be freed from the switch metal oxide leaving a switch oxide metal atom (one shown as 416-0).

FIG. 4C shows the formation of a conductive region 420 through switch layer 406. As shown, a portion of a conductive region 420 can be formed by the semimetal(s)/semiconductor(s) (SM), while another portion can be formed by switch oxide metal atoms (M2). In addition, in some embodiments, oxygen freed from the switch metal oxide can form an oxide with the anode metal to form an anode oxide (shown as 418).

Electric field(s) opposite to that of FIG. 4B can be applied to essentially reverse the operations shown in FIGS. 4B and 4C to return an element to a state like that of FIG. 4A.

It is understood that FIGS. 2A to 4C are but diagrammatic representations of operation. Actual position or states of semimetal(s)/semiconductor(s) atoms and/or compounds can take various forms.

Figure 5:
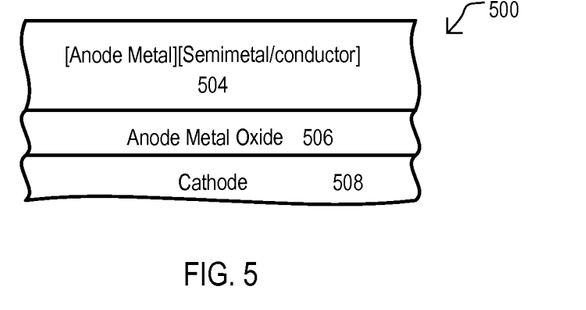
FIG. 5 is a side cross sectional view of a memory element according to another embodiment.

FIG. 5 is a side cross sectional view of a memory cell 500 according to another embodiment. A first electrode 504 can be a mix of one or more anode metals and one or more semimetal(s)/semiconductor(s). In some embodiments, a first electrode 504 can be a binary alloy of one anode metal and one semimetal/semiconductor.

A switch layer 506 can include, or be formed entirely of, a metal oxide of the anode metal. In some embodiments, and as described herein, in a programming operation (an operation that forms a conductive region in switch layer 506) oxygen can be freed from the switch layer and bind with the anode metal to form the anode metal oxide at the first electrode 504. A second electrode 408 can be formed of any suitable conductive material(s).

Figure 6:
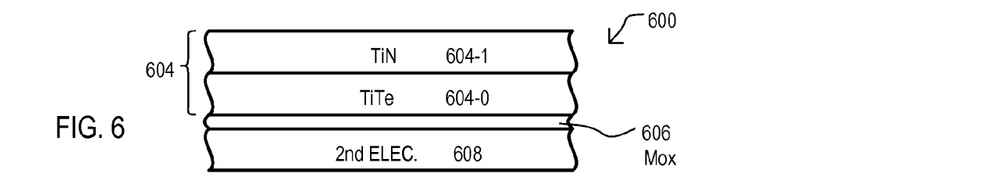
FIG. 6 is a side cross sectional view of a memory element according to another embodiment.

FIG. 6 is a side cross sectional view of a memory cell according to one very particular embodiment. A first electrode 604 can include a layer 604-0 that is a mix of a metal and a semimetal(s)/semiconductor(s). Layer 604-0 can be in direct contact with a switch layer 606. In one particular embodiment, layer 604-0 can include the metal titanium (Ti) and the semimetal(s)/semiconductor(s) can be Te (i.e., layer 604-0 is a Ti/Te compound).

Referring still to FIG. 6, first electrode 604 can include another conductive layer 604-1 formed on layer 604-0. In one particular embodiment, a layer 604-1 can be titanium nitride (TiN).

In the embodiment shown, switch layer 606 can be a metal oxide. The switch layer 606 can be formed on a second electrode 608. Switch layer 606 and second electrode 608 can be formed of any suitable materials described herein, or equivalents.

Figure 7:
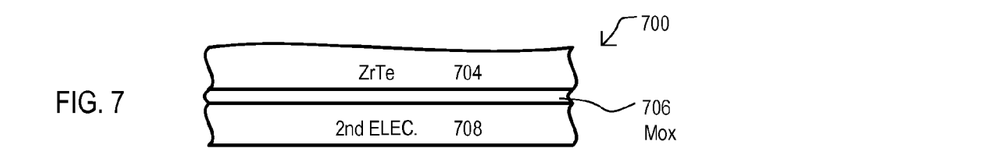
FIG. 7 is a side cross sectional view of a memory element according to another embodiment.

FIG. 7 is a side cross sectional view of a memory cell according to another very particular embodiment. A first electrode 704 can include an anode metal of Zr and the semimetal/semiconductor Te (i.e., layer 704 is a Zr/Te compound). Remaining layers (706, 708) can vary according to the various embodiments disclosed herein. In a particular embodiment, switch layer 706 can be formed all, or in part, of ZrOx. However, switch layer 706 and second electrode 708 can be formed of any suitable materials described herein, or equivalents.

Figure 8:
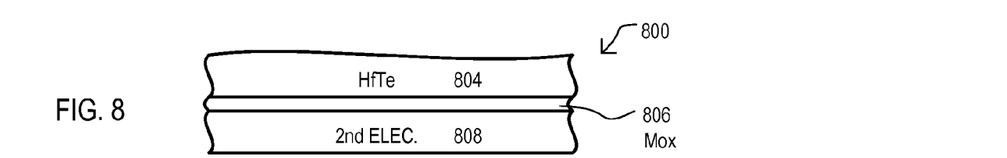
FIG. 8 is a side cross sectional view of a memory element according to another embodiment.

FIG. 8 is a side cross sectional view of a memory cell according to another very particular embodiment. A first electrode 804 can include an anode metal of Hf and the semimetal/semiconductor Te (i.e., layer 804 is an Hf/Te compound). Remaining layers (806, 808) can vary according to the various embodiments disclosed herein. In a particular embodiment, switch layer 806 can be formed all, or in part, of HfOx. However, switch layer 706 and second electrode 708 can be formed of any suitable materials described herein, or equivalents.

Figure 9A:
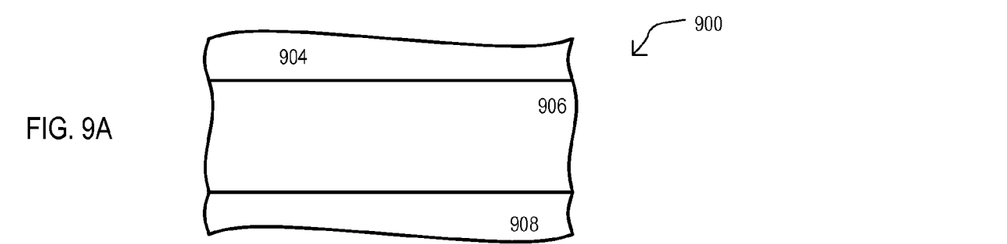
FIGS. 9A to 9C are side cross sectional views showing the formation of a memory element according to an embodiment.
Figure 9B:
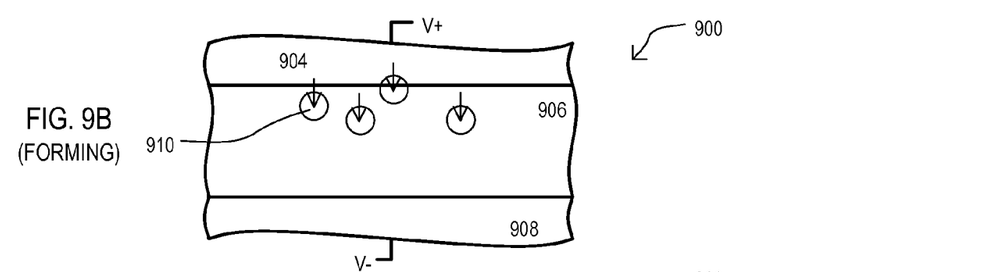
Figure 9C:
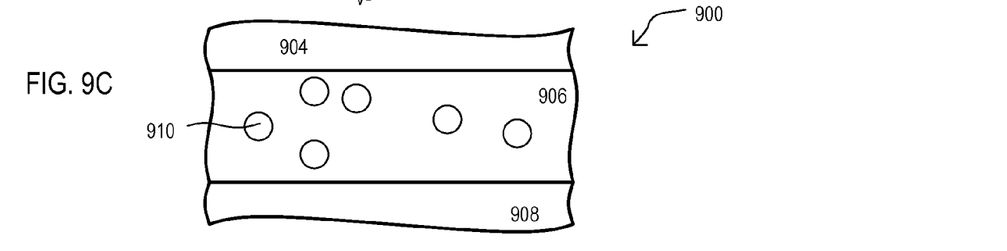

FIGS. 9A to 9C show a method for creating a memory element 900 according to an embodiment. FIGS. 9A to 9C show a method in which an electrical "forming" step can be used to place semimetal(s)/semiconductor(s) into a switch layer.

FIG. 9A shows a "fresh" memory element 900. A fresh memory element 900 can be a memory element following physical processing steps, but prior to any electrical testing. That is, the memory element 900 has not been subject to applied electrical biases. Very little or none of the semimetal(s)/semiconductor(s) that can form a conductive structure within the switch layer can be present in the switch layer 906.

FIG. 9B shows a "forming" step. A bias can be applied across the electrodes 904/908 of a first polarity. In response, semimetal(s)/semiconductor(s) 910 can move out of the first electrode 904 (i.e., anode) into the switch layer 906. As in other embodiments shown herein, 910 can represent semimetal(s)/semiconductor(s) atoms, but on other embodiments, semimetal(s)/semiconductor(s) can be compounds of more than one atom.

FIG. 9C shows a memory element 900 following the forming step. Semimetal(s)/semiconductor(s) 910 can be distributed within an insulating switch layer 906. A first electrode 904, switch layer 906 and second electrode 908 can be formed of any suitable materials described herein, or equivalents.

In some embodiments, an element 900 can then be programmed as shown in FIGS. 2A to 2C.

Figure 10A:
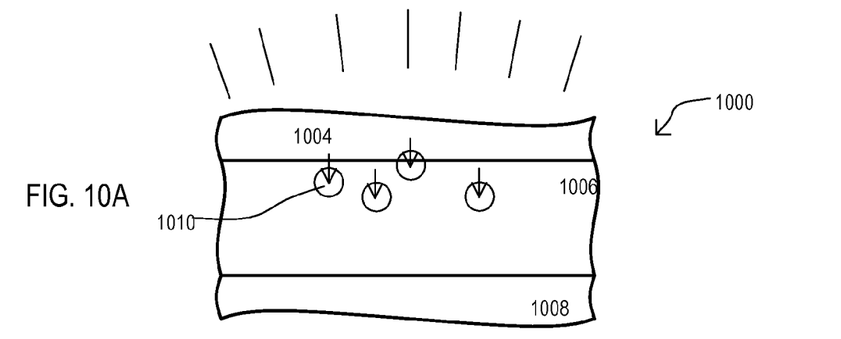
FIGS. 10A and 10B are side cross sectional views showing the formation of a memory element according to another embodiment.
Figure 10B:
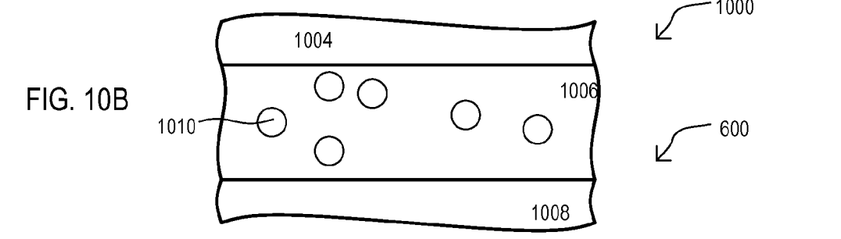

FIGS. 10A and 10B show a method for creating a memory element 1000 according to another embodiment. FIGS. 10A and 10B show a method in which a fabrication step places a semimetal(s)/semiconductor(s) into a switch layer.

FIG. 10A shows an incorporation step for memory element 1000. Prior to such a step, a first electrode 1004 of a memory element can be formed that includes the semimetal(s)/semiconductor(s) for forming conductive paths through an insulating switch layer 1006. A memory element 1000 can be subject to process treatment that results in semimetal(s)/semiconductor(s) 1010 moving out of the first electrode 1004 (i.e., anode) and into the switch layer 1006. Such a process treatment can include a heat treatment, chemical treatment, or light treatment. As in other embodiments shown herein, 1010 can represent semimetal(s)/semiconductor(s) atoms, but on other embodiments, semimetal(s)/semiconductor(s) can be compounds of more than one atom.

FIG. 10B shows a memory element 1000 following the treatment step. Semimetal(s)/semiconductor(s) 1010 can be distributed within an insulating switch layer 1006.

In some embodiments, an element 1000 can then be programmed as shown in FIGS. 2A to 2C.

Figure 11A:
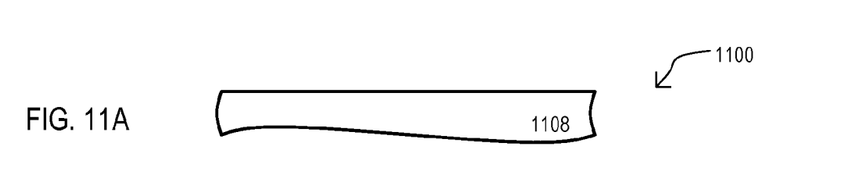
FIGS. 11A to 11C are side cross sectional views showing the formation of a memory element according to a further embodiment.
Figure 11B:
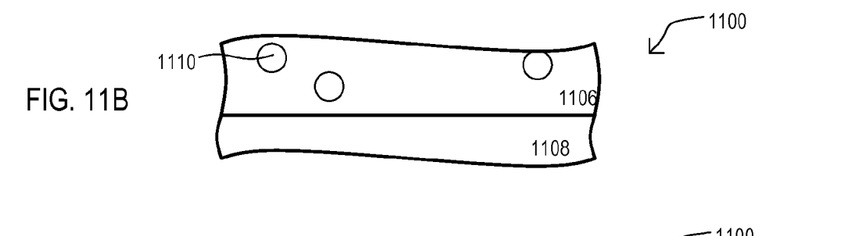
Figure 11C:
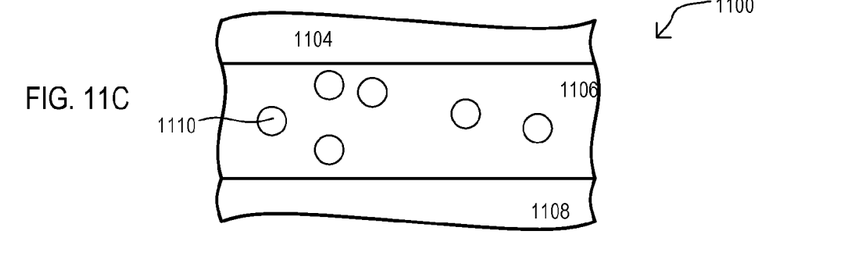

FIGS. 11A to 11C shows a method for creating a memory element 1100 according to another embodiment. FIGS. 11A to 11C shows a method in which semimetal(s)/semiconductor(s) can be formed in situ within switch layer.

FIG. 11A shows the formation of a second electrode 1108.

FIG. 11B shows the formation of a switching layer 1106 that includes semimetal(s)/semiconductor(s) 1110.

FIG. 11C shows the formation of a first electrode 1104. Semimetal(s)/semiconductor(s) 1110 can be distributed within an insulating switch layer 1106.

The various structures of FIGS. 11A to 11C can be formed of elements according to any of the embodiments herein, or equivalents.

In some embodiments, an element 1100 can then be programmed as shown in FIGS. 2A to 2C.

It is noted that while embodiments show layers with a particular vertical orientation, alternate embodiments can have a different orientation. As but one example, an insulating material can be formed over a layer containing the semi-metal and/or semiconductor that can form a conductive structure. Further, other embodiments can have a lateral arrangement, with an insulating layer having a vertical orientation between a layer containing the semi-metal and/or semiconductor that can form a conductive structure.

It should be appreciated that reference throughout this description to "one embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A memory element programmable between different impedance states, comprising:
a first electrode layer comprising a semimetal or semiconductor (semimetal/semiconductor);
a second electrode; and
a switch layer in physical contact with the first and second electrodes and comprising an insulating material, the switch layer configured to create a reversible change in the impedance of the memory element by altering the impedance of conductive regions traversing the insulating material by application of electric fields, the conductive regions comprising semimetal/semiconductor atoms from the first electrode layer; wherein,
the impedance is relatively high in response to application of a voltage having a first polarity with respect to the first and second electrodes, and the impedance is relatively low in response to application of a voltage having a second polarity with respect to the first and second electrodes.

2. The memory element of claim 1, wherein:
the semimetal/semiconductor is selected from the group of: carbon (C), tellurium (Te), antimony (Sb), arsenic (As), germanium (Ge), silicon (Si), bismuth (Bi), tin (Sn), sulfur (S), selenium (Se).

3. The memory element of claim 1, wherein:
the first electrode includes the semimetal/semiconductor in combination with at least one first electrode metal.

4. The memory element of claim 3, wherein:
the first electrode metal is a transition metal.

5. The memory element of claim 4, wherein:
the first electrode metal is a rare earth metal.

6. The memory element of claim 3, wherein:
the first electrode metal is not a transition metal.

7. The memory element of claim 1, wherein:
the insulating material comprises a metal oxide.

8. The memory element of claim 7, wherein:
the metal of the metal oxide is a transition metal.

9. The memory element of claim 8, wherein:
the metal of the metal oxide is a rare earth metal.

10. The memory element of claim 7, wherein:
the metal of the metal oxide is not a transition metal.

11. The memory element of claim 7, wherein:
the insulating material is selected from the group of gadolinium oxide, hafnium oxide, tantalum oxide, aluminum oxide, and zirconium oxide in stoichiometric or non-stoichiometric forms.

12. The memory element of claim 1, wherein:
the first electrode includes the semimetal/semiconductor and an electrode metal; and
the insulating material is a metal oxide of the electrode metal.

13. The memory element of claim 1, wherein:
the semimetal/semiconductor comprises tellurium;
the first electrode further includes a metal selected from, titanium, zirconium and hafnium; and
the switch layer comprises a metal oxide.

* * * * *